US010109332B2

(12) United States Patent
Shimizu et al.

(10) Patent No.: US 10,109,332 B2
(45) Date of Patent: Oct. 23, 2018

(54) MAGNETIC MEMORY DEVICE

(71) Applicant: Kabushiki Kaisha Toshiba, Minato-ku (JP)

(72) Inventors: Mariko Shimizu, Nerima (JP); Yuichi Ohsawa, Yokohama (JP); Hideyuki Sugiyama, Kawasaki (JP); Satoshi Shirotori, Yokohama (JP); Altansargai Buyandalai, Kawasaki (JP); Yushi Kato, Chofu (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/704,672

(22) Filed: Sep. 14, 2017

(65) Prior Publication Data
US 2018/0277185 A1 Sep. 27, 2018

(30) Foreign Application Priority Data

Mar. 21, 2017 (JP) ................................ 2017-054226

(51) Int. Cl.
*G11C 11/00* (2006.01)
*G11C 11/16* (2006.01)
(Continued)

(52) U.S. Cl.
CPC .......... *G11C 11/165* (2013.01); *G11C 11/161* (2013.01); *H01L 43/02* (2013.01); *H01L 43/08* (2013.01)

(58) Field of Classification Search
CPC ..... G11C 11/165; G11C 11/161; H01L 43/02; H01L 43/08
(Continued)

(56) References Cited

U.S. PATENT DOCUMENTS 5,940,319 A * 8/1999 Durlam ................. B82Y 10/00
257/E21.665
6,996,001 B2 * 2/2006 Ezaki ..................... G11C 11/16
365/171
(Continued)

FOREIGN PATENT DOCUMENTS

JP 2005-19457 A 1/2005
JP 2013-69727 A 4/2013
(Continued)

*Primary Examiner* — Fernando Hidalgo
(74) *Attorney, Agent, or Firm* — Oblon, McClelland, Maier & Neustadt, L.L.P.

(57) ABSTRACT

According to one embodiment, a magnetic memory device includes a conductive layer, a first magnetic layer, a first nonmagnetic layer, a second magnetic layer, a first conductive region, a first insulating region, and a controller. The conductive layer includes a first element. The conductive layer includes a first portion, a second portion, a third portion between the first portion and the second portion, and a fourth portion between the second portion and the third portion. The first conductive region includes a second element different from the first element. The first conductive region is provided between the second magnetic layer and the third portion. The first insulating region includes a first insulating substance. The first insulating substance is an insulating compound of the second element. The controller is electrically connected to the first portion and the second portion. The controller implements a first operation and a second operation.

20 Claims, 11 Drawing Sheets

(51) Int. Cl.
*H01L 43/08* (2006.01)
*H01L 43/02* (2006.01)

(58) Field of Classification Search
USPC .......................................................... 365/158
See application file for complete search history.

(56) References Cited

U.S. PATENT DOCUMENTS

| | | | |
|---|---|---|---|
| 7,369,428 B2 * | 5/2008 | Jeong | .................. G11C 11/16 |
| | | | 365/158 |
| 9,269,415 B1 | 2/2016 | Liu et al. | |
| 2004/0257865 A1 | 12/2004 | Honjo et al. | |
| 2013/0069186 A1 | 3/2013 | Toko et al. | |
| 2014/0056060 A1 | 2/2014 | Khvalkovskiy et al. | |
| 2014/0056061 A1 | 2/2014 | Khvalkovskiy et al. | |
| 2015/0076485 A1 | 3/2015 | Sandhu et al. | |
| 2016/0225982 A1 | 8/2016 | Guo | |
| 2016/0276006 A1 | 9/2016 | Ralph et al. | |
| 2017/0033281 A1 | 2/2017 | Hu | |
| 2017/0076769 A1 | 3/2017 | Shirotori et al. | |
| 2018/0040812 A1 | 2/2018 | Shimizu et al. | |

FOREIGN PATENT DOCUMENTS

| | | |
|---|---|---|
| JP | 2014-45196 A | 3/2014 |
| JP | 2016-534576 A | 11/2016 |
| JP | 2017-59594 A | 3/2017 |
| JP | 2018-22805 A | 2/2018 |

\* cited by examiner

MAGNETIC MEMORY DEVICE

CROSS-REFERENCE TO RELATED APPLICATIONS

This application is based upon and claims the benefit of priority from Japanese Patent Application No. 2017-054226, filed on Mar. 21, 2017; the entire contents of which are incorporated herein by reference.

FIELD

Embodiments described herein relate generally to a magnetic memory device.

BACKGROUND

It is desirable to reduce the operating voltage of a magnetic memory device.

DETAILED DESCRIPTION

Figure 1:
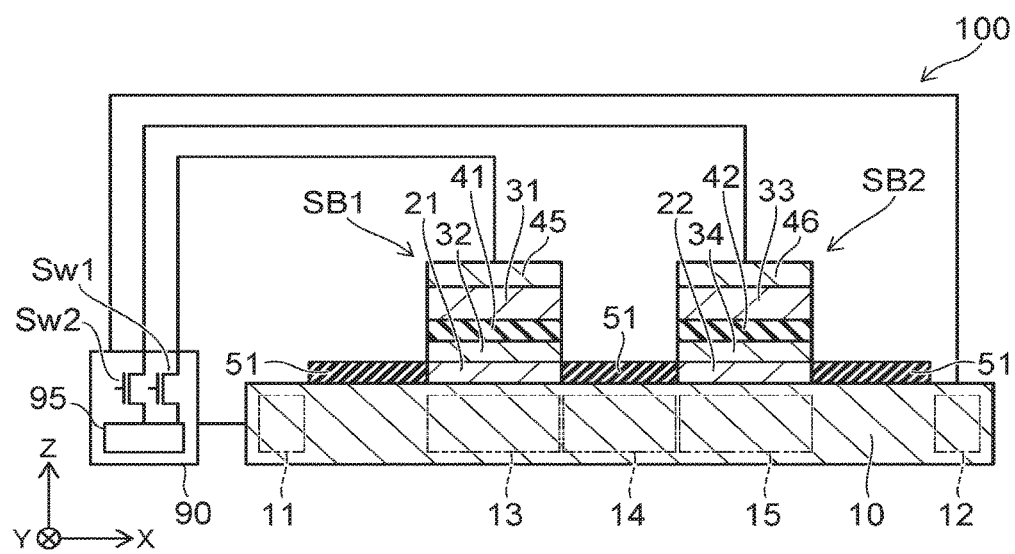
FIG. 1 is a cross-sectional view illustrating a magnetic memory device according to a first embodiment.

According to one embodiment, a magnetic memory device includes a conductive layer, a first magnetic layer, a first nonmagnetic layer, a second magnetic layer, a first conductive region, a first insulating region, and a controller. The conductive layer includes a first element. The conductive layer includes a first portion, a second portion, a third portion between the first portion and the second portion, and a fourth portion between the second portion and the third portion. The first magnetic layer is separated from the third portion in a second direction crossing a first direction. The first direction is from the first portion toward the second portion. At least a portion of the first nonmagnetic layer is provided between the first magnetic layer and at least a portion of the third portion. At least a portion of the second magnetic layer is provided between the first nonmagnetic layer and at least a portion of the third portion. The first conductive region includes a second element different from the first element. At least a portion of the first conductive region is provided between the second magnetic layer and at least a portion of the third portion. The first insulating region includes a first insulating substance. The first insulating substance is an insulating compound of the second element. A direction from the fourth portion toward at least a portion of the first insulating region is aligned with the second direction. The controller is electrically connected to the first portion and the second portion. The controller implements a first operation and a second operation. The controller in the first operation supplies a first current to the conductive layer from the first portion toward the second portion. The controller in the second operation supplies a second current to the conductive layer from the second portion toward the first portion.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

FIG. 1 is a cross-sectional view illustrating a magnetic memory device according to a first embodiment.

The magnetic memory device 100 illustrated in FIG. 1 includes a conductive layer 10, a first conductive region 21, a first magnetic layer 31, a second magnetic layer 32, a first nonmagnetic layer 41, a first insulating region 51, and a controller 90.

The conductive layer 10 includes a first portion 11, a second portion 12, a third portion 13, and a fourth portion 14. The third portion 13 is provided between the first portion 11 and the second portion 12. The fourth portion 14 is provided between the second portion 12 and the third portion 13. The conductive layer 10 includes a metallic element.

The direction from the first portion 11 toward the second portion 12 is taken as a first direction. For example, the first direction is aligned with an X-axis direction illustrated in FIG. 1. One direction perpendicular to the X-axis direction is taken as a Y-axis direction. A direction perpendicular to the X-axis direction and the Y-axis direction is taken as a Z-axis direction. A direction that crosses the first direction is taken as a second direction. For example, the second direction is aligned with the Z-axis direction.

The case will now be described where the first direction and the second direction are aligned respectively with the X-axis direction and the Z-axis direction.

The first magnetic layer 31 is separated from the third portion 13 in the Z-axis direction. At least a portion of the first nonmagnetic layer 41 is provided between the first magnetic layer 31 and at least a portion of the third portion 13 in the Z-axis direction.

At least a portion of the second magnetic layer 32 is provided between the first nonmagnetic layer 41 and at least a portion of the third portion 13 in the Z-axis direction. At least a portion of the first conductive region 21 is provided between the second magnetic layer 32 and at least a portion of the third portion 13.

At least a portion of the first conductive region 21, at least a portion of the second magnetic layer 32, at least a portion of the first nonmagnetic layer 41, and at least a portion of the first magnetic layer 31 are provided between an electrode 45 and at least a portion of the third portion 13 in the Z-axis direction.

The direction from the fourth portion 14 toward the first insulating region 51 is aligned with the Z-axis direction. The direction from the first conductive region 21 toward the first insulating region 51 is aligned with the X-axis direction.

The controller 90 is electrically connected to the first portion 11 and the second portion 12. The controller 90 implements a first operation and a second operation. In the first operation, the controller 90 supplies a first current to the conductive layer 10 from the first portion 11 toward the second portion 12. In the second operation, the controller 90 supplies a second current to the conductive layer 10 from the second portion 12 toward the first portion 11. For example, the first operation and the second operation correspond to at least a portion of a program operation.

According to the embodiment, the operating voltage (e.g., the programming voltage) of the magnetic memory device 100 can be reduced.

The magnetic memory device 100 according to the first embodiment will now be described in detail.

The magnetic memory device 100 further includes, for example, a third magnetic layer 33, a fourth magnetic layer 34, a second nonmagnetic layer 42, and an electrode 46. The conductive layer 10 further includes a fifth portion 15. The fifth portion 15 is provided between the second portion 12 and the fourth portion 14.

The third magnetic layer 33 is separated from the fifth portion 15 in the Z-axis direction. At least a portion of the second nonmagnetic layer 42 is provided between the third magnetic layer 33 and at least a portion of the fifth portion 15 in the Z-axis direction.

At least a portion of the fourth magnetic layer 34 is provided between the second nonmagnetic layer 42 and at least a portion of the fifth portion 15 in the Z-axis direction. At least a portion of a second conductive region 22 is provided between the second magnetic layer 32 and at least a portion of the fifth portion 15 in the Z-axis direction.

At least a portion of the second conductive region 22, at least a portion of the fourth magnetic layer 34, at least a portion of the second nonmagnetic layer 42, and at least a portion of the third magnetic layer 33 are provided between the electrode 46 and at least a portion of the fifth portion 15 in the Z-axis direction.

A first stacked body SB1 includes the second magnetic layer 32, the first nonmagnetic layer 41, the first magnetic layer 31, and the electrode 45. A second stacked body SB2 includes the fourth magnetic layer 34, the second nonmagnetic layer 42, the third magnetic layer 33, and the electrode 46. The first stacked body SB1 is separated from the second stacked body SB2 in the X-axis direction.

For example, the first insulating region 51 is multiply provided in the X-axis direction. One of the multiple first insulating regions 51 is provided between the first conductive region 21 and the second conductive region 22 in the X-axis direction.

The first stacked body SB1 and the second stacked body SB2 function as, for example, magnetic variable resistance elements. The electrical resistance value of a path including the first magnetic layer 31, the first nonmagnetic layer 41, and the second magnetic layer 32 changes according to the relative relationship between the orientation of the magnetization of the first magnetic layer 31 and the orientation of the magnetization of the second magnetic layer 32. Similarly, the electrical resistance value of a path including the third magnetic layer 33, the second nonmagnetic layer 42, and the fourth magnetic layer 34 changes according to the relative relationship between the orientation of the magnetization of the third magnetic layer 33 and the orientation of the magnetization of the fourth magnetic layer 34. For example, the first nonmagnetic layer 41 and the second nonmagnetic layer 42 are insulative; and the first stacked body SB1 and the second stacked body SB2 have magnetic tunnel junctions.

The first magnetic layer 31 and the third magnetic layer 33 function as, for example, reference layers. The second magnetic layer 32 and the fourth magnetic layer 34 function as, for example, memory layers. For example, a first state in which the magnetization of the second magnetic layer 32 is oriented in one direction corresponds to first information to be stored. A second state in which the magnetization of the second magnetic layer 32 is oriented in another direction corresponds to second information to be stored. The first information corresponds to, for example, one of "0" or "1." The second information corresponds to the other of "0" or "1."

The orientations of the magnetizations of the second magnetic layer 32 and the fourth magnetic layer 34 can be controlled by, for example, the orientation of the current flowing through the conductive layer 10. The conductive layer 10 functions as, for example, a spin orbit layer (SOL). For example, the orientations of the magnetizations of the second magnetic layer 32 and the fourth magnetic layer 34 can be changed by the spin-orbit torque generated between the conductive layer 10 and these magnetic layers. The spin-orbit torque is based on the current flowing in the conductive layer 10.

The controller 90 supplies the current to the conductive layer 10. The controller 90 includes, for example, a drive circuit 95 and multiple switch elements Sw (Sw1 and Sw2). The controller 90 is electrically connected to the first portion 11, the second portion 12, the first magnetic layer 31, and the third magnetic layer 33. The first switch element Sw1 is provided on a current path between the first magnetic layer 31 and the drive circuit 95. The second switch element Sw2 is provided on a current path between the third magnetic layer 33 and the drive circuit 95.

In the first operation (a first program operation), the controller 90 supplies the first current to the conductive layer 10. The first current flows from the first portion 11 toward the second portion 12. Thereby, the first state is formed. In the second operation, the controller 90 supplies the second current to the conductive layer 10. The second current flows from the second portion 12 toward the first portion 11. Thereby, the second state is formed.

A first electrical resistance value between the first magnetic layer 31 and the first portion 11 after the first operation (the first state) is different from a second electrical resistance value between the first magnetic layer 31 and the first portion 11 after the second operation (the second state). The difference of the electrical resistance values is based on, for example, the difference of the orientation of the magnetization of the second magnetic layer 32 between the first state and the second state.

Or, in a third operation (a third program operation), the controller 90 supplies a third current to the conductive layer 10. The third current flows from the first portion 11 toward the second portion 12. Thereby, a third state is formed. In a fourth operation, the controller 90 supplies a fourth current to the conductive layer 10. The fourth current flows from the second portion 12 toward the first portion 11. Thereby, a fourth state is formed.

A third electrical resistance value between the third magnetic layer 33 and the first portion 11 after the third operation (the third state) is different from a fourth electrical resistance value between the third magnetic layer 33 and the first portion 11 after the fourth operation (the fourth state). The difference of the electrical resistance values is based on, for example, the difference of the orientation of the magnetization of the fourth magnetic layer 34 between the third state and the fourth state.

In a read operation, the controller 90 senses, for example, the electrical resistance value between the first magnetic layer 31 and the first portion 11 or between the third magnetic layer 33 and the first portion 11. The controller 90 may sense a characteristic corresponding to these electrical resistance values such as a voltage value, a current value, etc.

One of the multiple stacked bodies SB (SB1 or SB2) is selected by the operations of the multiple switch elements Sw. The program operation and the read operation can be performed for the selected stacked body. When the one of the multiple stacked bodies SB is selected, a prescribed select voltage is applied to the stacked body SB. At this time, an unselect voltage is applied to the other stacked bodies SB. The potential of the select voltage is different from the potential of the unselect voltage. As long as the potential of the select voltage is different from the potential of the unselect voltage, the select voltage may be 0 volts.

The conductive layer 10 may include a nonmagnetic material. The conductive layer 10 may be nonmagnetic. The conductive layer 10 includes, for example, at least one first element selected from a first group consisting of tantalum, tungsten, rhenium, osmium, iridium, platinum, gold, copper, silver, and palladium.

The conductive layer 10 includes, for example, at least one selected from the group consisting of β-tantalum and β-tungsten. The spin Hall angle is negative for these materials. The absolute value of the spin Hall angle is large for these materials. Thereby, in the program operation, the orientation of the magnetization of the second magnetic layer 32 and the orientation of the magnetization of the fourth magnetic layer 34 can be controlled efficiently by the current flowing in the conductive layer 10.

The conductive layer 10 may include at least one selected from the group consisting of platinum and gold. The spin Hall angle is positive for these materials. The absolute value of the spin Hall angle is large for these materials. Thereby, in the program operation, the orientation of the magnetization of the second magnetic layer 32 and the orientation of the magnetization of the fourth magnetic layer 34 can be controlled efficiently by the current flowing in the conductive layer 10.

The direction (the orientation) of the spin-orbit torque applied to the second magnetic layer 32 and the fourth magnetic layer 34 is different according to the polarity of the spin Hall angle. For example, the conductive layer 10 applies a spin-orbit interaction torque to the second magnetic layer 32 and the fourth magnetic layer 34.

The first conductive region 21 includes a second element that is different from the first element. The second element is at least one selected from a second group consisting of boron, magnesium, aluminum, silicon, hafnium, titanium, cesium, zirconium, strontium, lithium, beryllium, calcium, and lanthanum.

The first conductive region 21 further includes at least one element selected from the first group described above. The first conductive region 21 further includes, for example, the first element.

The first magnetic layer 31 includes, for example, Co (cobalt) or CoFeB (cobalt-iron-boron). For example, the orientation of the magnetization of the first magnetic layer 31 is aligned with a direction in a plane including the X-axis direction and the Y-axis direction. The orientation of the magnetization of the first magnetic layer 31 does not change easily compared to the orientation of the magnetization of the second magnetic layer 32.

For example, the thickness of the first magnetic layer 31 is thicker than the thickness of the second magnetic layer 32. Thereby, the orientation of the magnetization of the first magnetic layer 31 does not change easily compared to the orientation of the magnetization of the second magnetic layer 32.

The first magnetic layer 31 may include, for example, first to third films. The first film is provided between the third film and the first nonmagnetic layer 41. The second film is provided between the first film and the third film. The first film includes, for example, a CoFeB film (having a thickness of, for example, not less than 1.5 nm and not more than 2.5 nm). The second film includes, for example, a Ru film (having a thickness of, for example, not less than 0.7 nm and not more than 0.9 nm). The third film includes, for example, a CoFeB film (having a thickness of, for example, not less than 1.5 nm and not more than 2.5 nm).

For example, an antiferromagnetic layer may be provided. The first magnetic layer 31 is provided between the antiferromagnetic layer and the first nonmagnetic layer 41. The antiferromagnetic layer is, for example, an IrMn-layer (having a thickness of not less than 7 nm and not more than 9 nm). The orientation of the magnetization of the first magnetic layer 31 changes less easily due to the antiferromagnetic layer. A Ta layer may be provided on the antiferromagnetic layer.

The second magnetic layer 32 includes, for example, at least one of a ferromagnetic material or a soft magnetic material. The second magnetic layer 32 may include, for example, an artificial lattice.

The second magnetic layer 32 includes the first magnetic material. The first magnetic material is, for example, at least one element selected from a third group consisting of Co, Fe, Ni. The second magnetic layer 32 includes, for example, at least one selected from the group consisting of FePd (iron-palladium), FePt (iron-platinum), CoPd (cobalt-palladium), and CoPt (cobalt-platinum). The soft magnetic materials recited above include, for example, CoFeB (cobalt-iron-boron). The artificial lattices recited above include, for example, a stacked film including the first film and the second film. The first film includes, for example, at least one selected from the group consisting of NiFe (nickel-iron), Fe (iron), and Co (cobalt). The second film includes, for example, at least one selected from the group consisting of Cu (copper), Pd (palladium), and Pt (platinum). The first film is, for example, a magnetic material; and the second film is a nonmagnetic material.

The second magnetic layer 32 may include, for example, a ferrimagnetic material.

The second magnetic layer 32 has in-plane magnetic anisotropy. Thereby, for example, a polarized spin that is antiparallel to the magnetization direction can be obtained from the conductive layer 10. For example, the second magnetic layer 32 may have at least one of in-plane shape magnetic anisotropy, in-plane magneto-crystalline anisotropy, or in-plane induced magnetic anisotropy due to stress or the like.

The first nonmagnetic layer 41 includes, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). The first nonmagnetic layer 41 is, for example, a tunneling barrier layer. In the case where the first nonmagnetic layer 41 includes MgO, the thickness of the first nonmagnetic layer 41 is, for example, about 1 nm.

The third magnetic layer 33 includes, for example, a material and a configuration that are similar to those of the first magnetic layer 31. The fourth magnetic layer 34 includes, for example, a material and a configuration that are similar to those of the second magnetic layer 32. The second nonmagnetic layer 42 includes, for example, a material and a configuration that are similar to those of the first nonmagnetic layer 41. The second conductive region 22 includes a material and a configuration that are similar to those of the first conductive region 21.

The first insulating region 51 includes a first insulating substance. The first insulating substance is an insulating compound of at least one element selected from a second group. The first insulating substance is, for example, an oxide or a nitride of at least one element selected from the second group. The first insulating region 51 may further include at least one selected from a fourth group consisting of an insulating compound of the first element and an insulating compound of a first magnetic material.

Figure 2A:
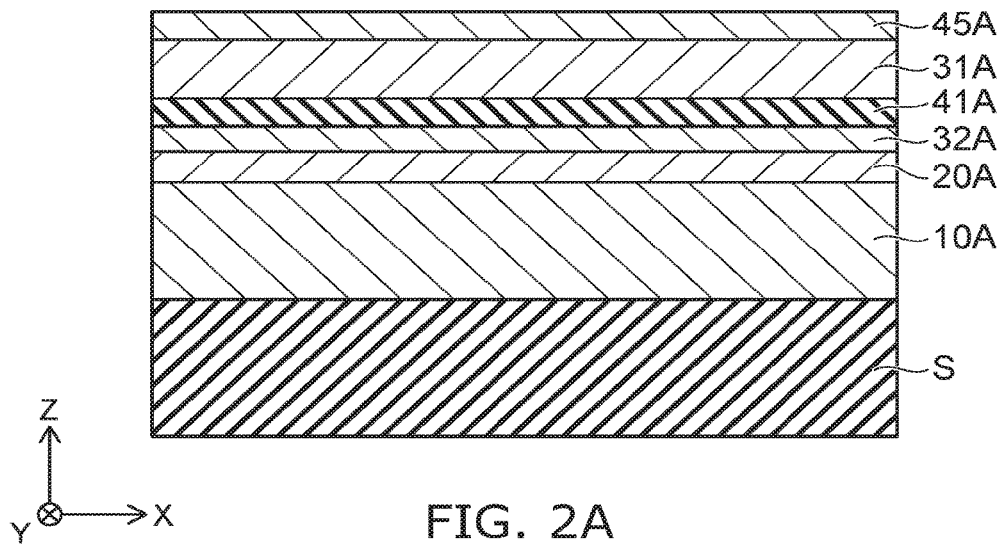
FIG. 2A is a cross-sectional view of a process, illustrating a manufacturing process of the magnetic memory device according to the first embodiment
Figure 2B:
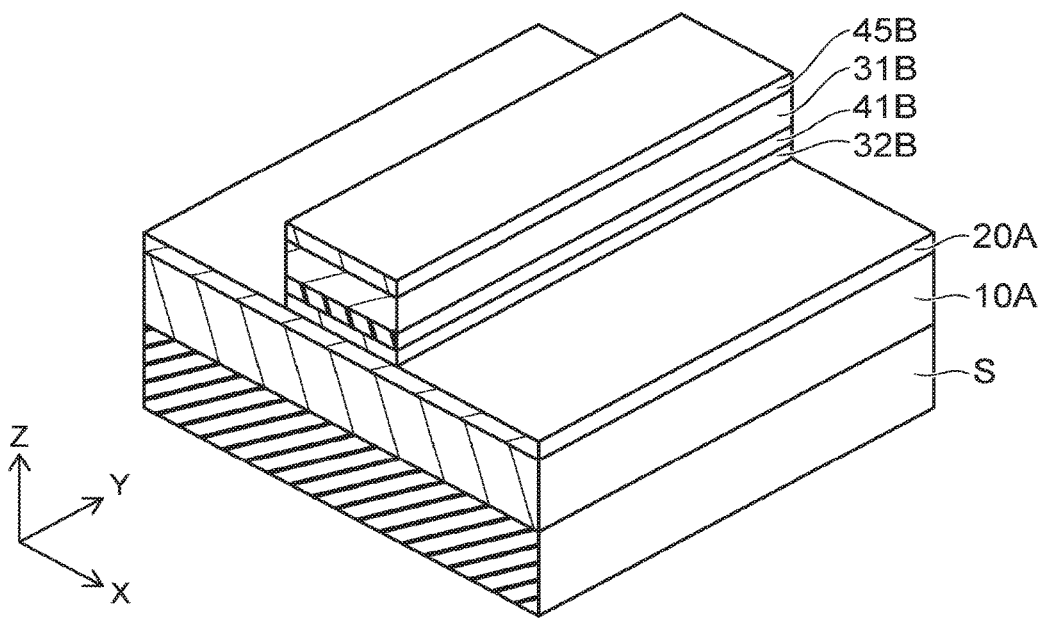
FIG. 2B, FIG. 3A, and FIG. 3B are process perspective views illustrating manufacturing processes of the magnetic memory device according to the first embodiment.
Figure 3A:
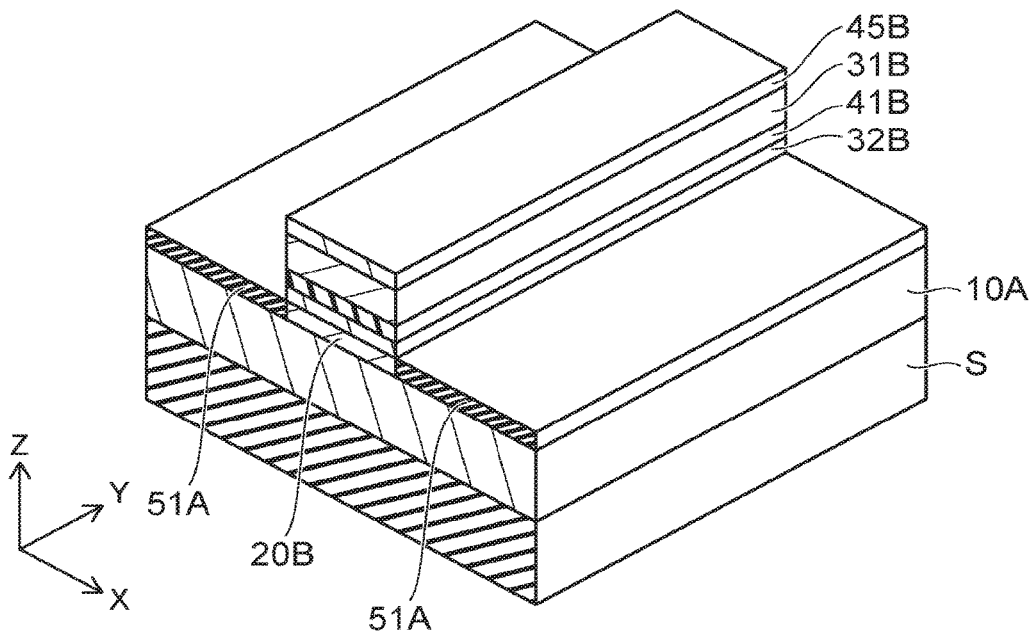
Figure 3B:
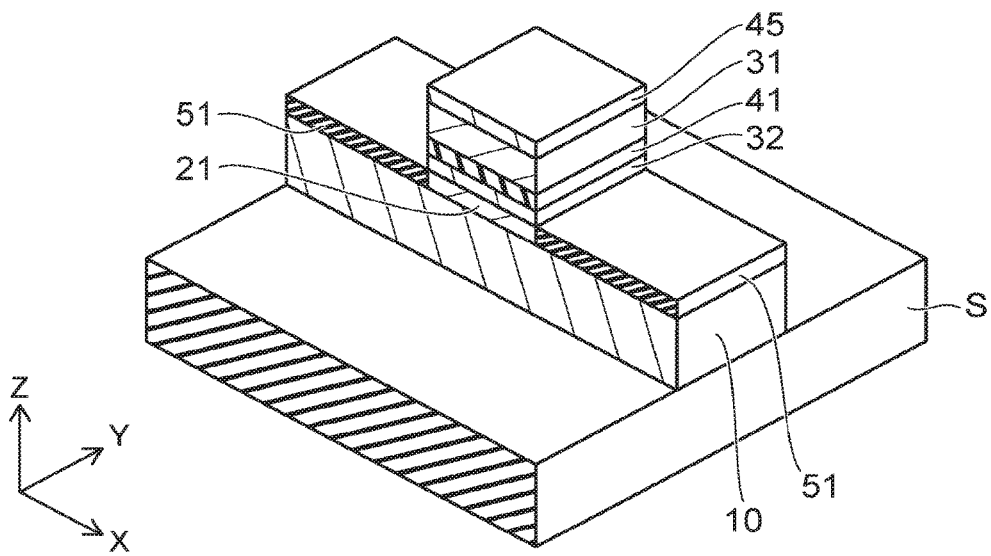

FIG. 2A is a cross-sectional view of a process, illustrating a manufacturing process of the magnetic memory device according to the first embodiment. FIG. 2B, FIG. 3A, and FIG. 3B are process perspective views illustrating manufacturing processes of the magnetic memory device according to the first embodiment.

A conductive film 10A is formed on a substrate S. A conductive film 20A is formed on the conductive film 10A. The conductive film 20A includes at least one element selected from the first group and at least one element selected from the second group. A magnetic film 32A is formed on the conductive film 20A. A nonmagnetic film 41A is formed on the magnetic film 32A. A magnetic film 31A is formed on the nonmagnetic film 41A. As illustrated in FIG. 2A, a metal film 45A is formed on the magnetic film 31A.

As illustrated in FIG. 2B, a portion of the metal film 45A, a portion of the magnetic film 31A, a portion of the nonmagnetic film 41A, and a portion of the magnetic film 32A are removed. This process is implemented using, for example, photolithography and ion milling. Thereby, a metal layer 45B, a magnetic layer 31B, a nonmagnetic layer 41B, and a magnetic layer 32B are formed. A portion of the conductive film 20A is exposed.

The exposed portion of the conductive film 20A is oxidized. The portion of the conductive film 20A is oxidized by, for example, irradiating oxygen plasma or an oxygen ion beam. Thereby, an insulating layer 51A is formed as illustrated in FIG. 3A. Or, the insulating layer 51A may be formed by nitriding a portion of the conductive film 20A.

A portion of the metal layer 45B, a portion of the magnetic layer 31B, a portion of the nonmagnetic layer 41B, a portion of the magnetic layer 32B, a portion of the insulating layer 51A, and a portion of the conductive film 10A are removed. Thereby, as illustrated in FIG. 3B, the conductive layer 10, the first conductive region 21, the second magnetic layer 32, the first nonmagnetic layer 41, the first magnetic layer 31, the electrode 45, and the first insulating region 51 are formed. By the processes recited above, the magnetic memory device 100 illustrated in FIG. 1 is made.

In the manufacturing method described above, the patterning of the magnetic film 32A, the nonmagnetic film 41A, the magnetic film 31A, and the metal film 45A is stopped when the conductive film 20A is exposed. Because the conductive film 10A is not patterned, the adhesion of the metallic element included in the conductive film 10A to the side wall of the nonmagnetic film 41A is suppressed. Also, the decrease of the thickness of the conductive film 10A is suppressed.

In the case where the insulating layer 51A is formed by oxidizing a portion of the conductive film 20A, the exposed portion of the conductive film 20A is oxidized; but the oxidization of the conductive film 10A is suppressed because the conductive film 20A includes the second element. For example, this is based on the standard formation energy (the Gibbs free energy) of oxides being smaller for the elements included in the second group than for the elements included in the first group. Because the conductive film 20A includes the element selected from the second group, the oxygen concentration of the conductive film 10A is reduced; and the oxidization of the conductive film 10A is suppressed.

Or, the amount of oxygen moving in the interior of the conductive layer 10 along the grains or subgrains included in the conductive layer 10 can be reduced by providing the conductive film 20A. In the case where the conductive film 20A is provided on the conductive layer 10, the amount of oxygen moving along the grain boundaries can be suppressed even if the grains or subgrains of the conductive layer 10 are transferred to the conductive film 20A. This is because the oxygen binding capacity of the conductive film 20A is higher than that of the conductive layer 10. Thereby, the electrical resistance of the conductive layer 10 is reduced; and the operating voltage of the magnetic memory device 100 can be reduced.

According to the embodiment, the electrical resistance of the conductive layer 10 can be reduced; and the operating voltage of the magnetic memory device 100 can be reduced.

Figure 4:
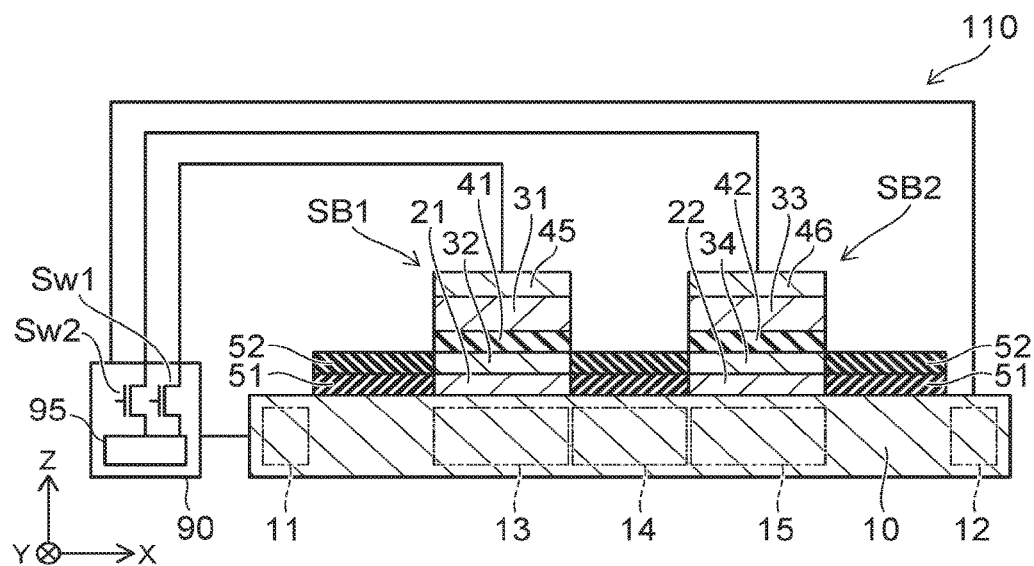
FIG. 4 to FIG. 6 are cross-sectional views illustrating another magnetic memory devices according to the first embodiment.

FIG. 4 is a cross-sectional view illustrating another magnetic memory device according to the first embodiment.

The magnetic memory device 110 illustrated in FIG. 4 further includes a second insulating region 52.

At least a portion of the first insulating region 51 is provided between the fourth portion 14 and at least a portion of the second insulating region 52 in the Z-axis direction. The direction from the second magnetic layer 32 toward the second insulating region 52 is aligned with the X-axis direction. The second insulating region 52 is provided between the second magnetic layer 32 and the fourth magnetic layer 34 in the X-axis direction.

The second insulating region 52 includes, for example, a second insulating substance that is different from the first insulating substance. The second insulating substance is an oxide or a nitride of the first magnetic material. The second insulating region 52 includes, for example, an oxide or a nitride of at least one selected from the group consisting of Co and Fe.

Figure 5:
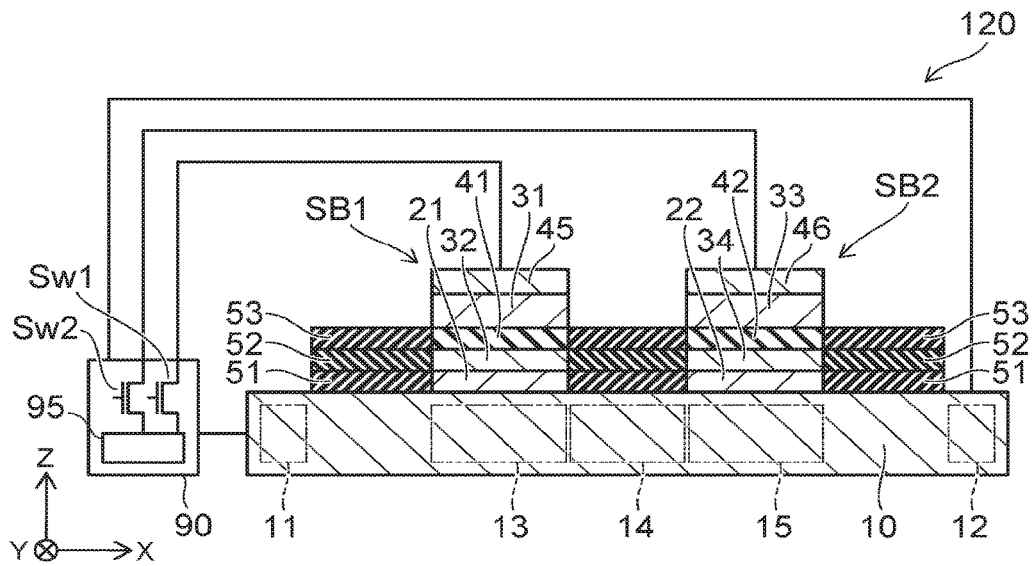

FIG. 5 is a cross-sectional view illustrating another magnetic memory device according to the first embodiment.

The magnetic memory device 120 illustrated in FIG. 5 further includes a third insulating region 53.

At least a portion of the second insulating region 52 is provided between the first insulating region 51 and at least a portion of the third insulating region 53 in the Z-axis direction. The direction from the first nonmagnetic layer 41 toward the third insulating region 53 is aligned with the X-axis direction. The third insulating region 53 is provided between the first nonmagnetic layer 41 and the second nonmagnetic layer 42 in the X-axis direction.

The third insulating region 53 includes a third insulating substance that is different from the first insulating substance and the second insulating substance. For example, the third insulating substance is the same as the oxide material included in the first nonmagnetic layer 41. Or, the third insulating substance includes an oxide of the metallic element included in the first nonmagnetic layer 41 and a nitride of the metallic element. Or, the third insulating substance may be a peroxidized oxide material of the oxide material included in the first nonmagnetic layer 41.

The third insulating substance is, for example, at least one selected from the group consisting of MgO (magnesium oxide), CaO (calcium oxide), SrO (strontium oxide), TiO (titanium oxide), VO (vanadium oxide), NbO (niobium oxide), and $Al_2O_3$ (aluminum oxide). Or, the third insulating substance may be a peroxidized insulating substance of at least one selected from the group.

Figure 6:
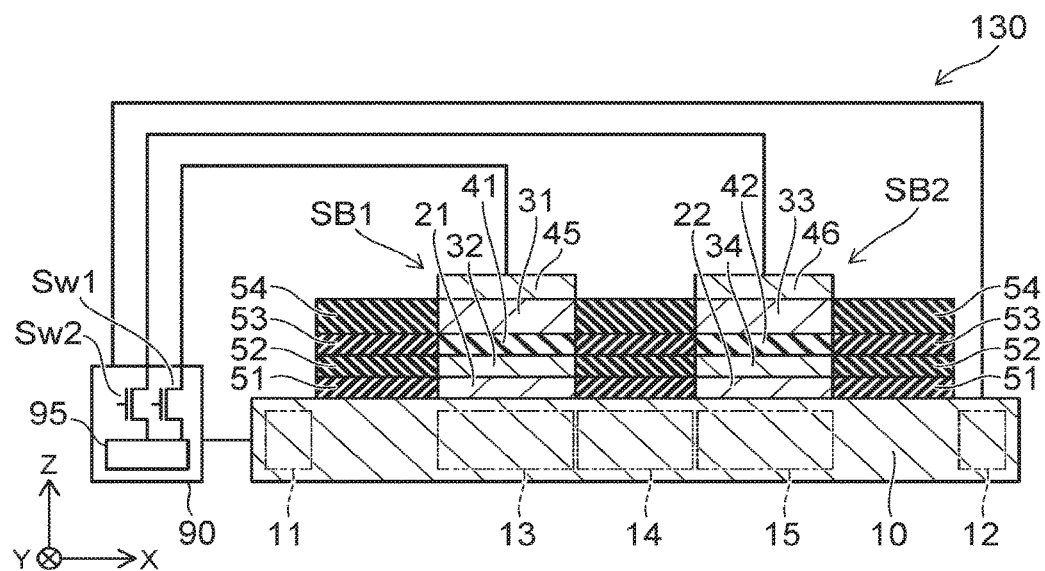

FIG. 6 is a cross-sectional view illustrating another magnetic memory device according to the first embodiment.

The magnetic memory device 130 illustrated in FIG. 6 further includes a fourth insulating region 54.

At least a portion of the third insulating region 53 is provided between the second insulating region 52 and at least a portion of the fourth insulating region 54 in the Z-axis direction. The direction from the first magnetic layer 31 toward the fourth insulating region 54 is aligned with the X-axis direction. The fourth insulating region 54 is provided between the first magnetic layer 31 and the third magnetic layer 33 in the X-axis direction.

The first magnetic layer 31 includes the second magnetic material. The fourth insulating region 54 includes, for example, a fourth insulating substance that is different from the first insulating substance and the third insulating substance. The fourth insulating substance is an oxide or a nitride of the second magnetic material. The fourth insulating region 54 includes, for example, an oxide or a nitride of at least one selected from the group consisting of Co and Fe.

Figure 7:
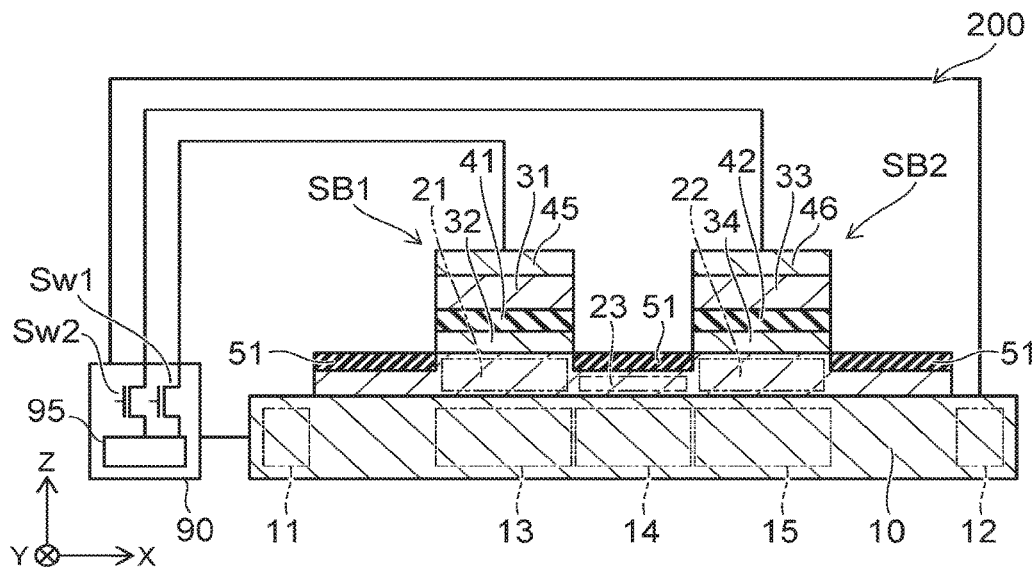
FIG. 7 is a cross-sectional view illustrating a magnetic memory device according to a second embodiment.

FIG. 7 is a cross-sectional view illustrating a magnetic memory device according to a second embodiment.

The magnetic memory device 200 illustrated in FIG. 7 further includes a third conductive region 23. The third conductive region 23 includes the same element as the first conductive region 21. At least a portion of the third conductive region 23 is provided between the fourth portion 14 and at least a portion of the first insulating region 51 in the Z-axis direction. For example, the third conductive region 23 is multiply provided in the X-axis direction. The multiple third conductive regions 23 are provided respectively between the conductive layer 10 and the multiple first insulating regions 51 in the Z-axis direction.

Similarly to the magnetic memory devices illustrated in FIG. 4 to FIG. 6, the magnetic memory device 200 illustrated in FIG. 7 may further include at least one of the second to fourth insulating regions 52 to 54.

Figure 8:
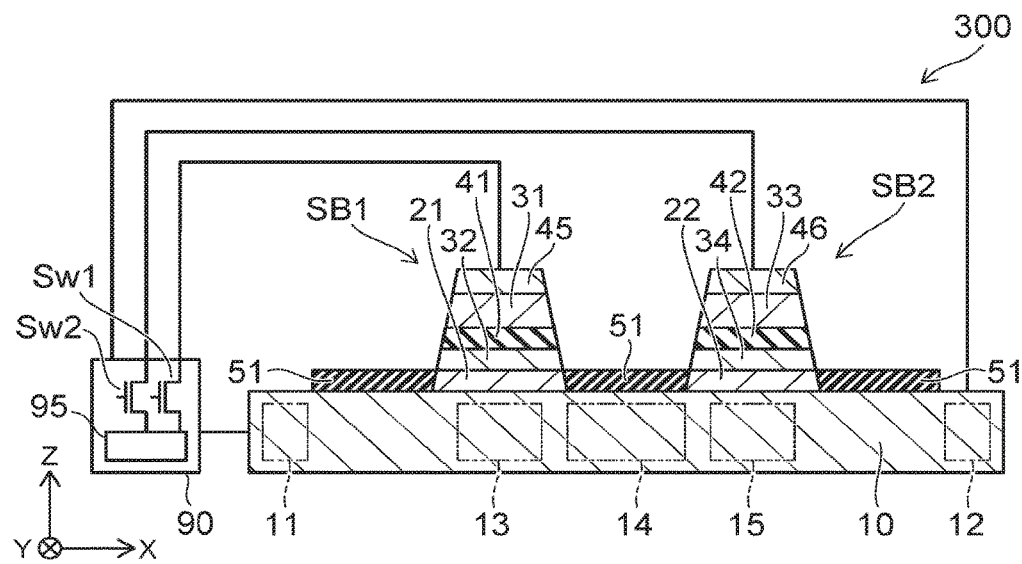
FIG. 8 is a cross-sectional view illustrating a magnetic memory device according to a third embodiment.

FIG. 8 is a cross-sectional view illustrating a magnetic memory device according to a third embodiment.

In the magnetic memory device 300 illustrated in FIG. 8, a portion of the first conductive region 21 and a portion of the second conductive region 22 are provided between the first insulating region 51 and a portion of the conductive layer 10 in the Z-axis direction. The end portions in the X-axis direction of the first conductive region 21 and the second conductive region 22 are provided between the first insulating region 51 and a portion of the conductive layer 10 in the Z-axis direction.

The surfaces of the first stacked body SB1 and the second stacked body SB2 crossing the X-axis direction are tilted with respect to the Z-axis direction. The surface of the first insulating region 51 crossing the X-axis direction is tilted with respect to the Z-axis direction.

Figure 9:
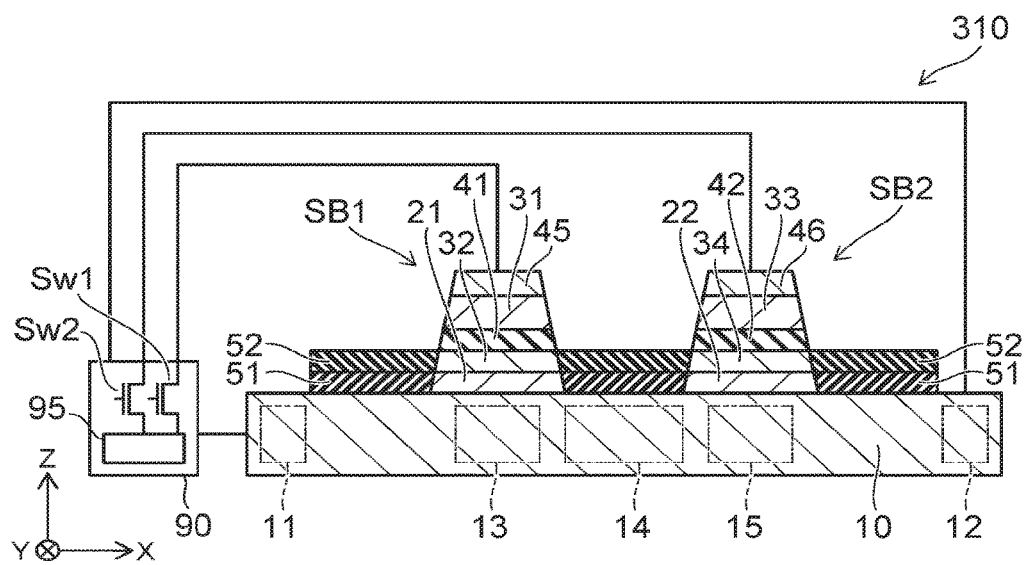
FIG. 9 to FIG. 11 are cross-sectional views illustrating another magnetic memory devices according to the third embodiment.

FIG. 9 is a cross-sectional view illustrating another magnetic memory device according to the third embodiment.

The magnetic memory device 310 illustrated in FIG. 9 further includes the second insulating region 52.

A portion of the second magnetic layer 32 is provided between a portion of the first conductive region 21 and a portion of the second insulating region 52 in the Z-axis direction. The end portion in the X-axis direction of the second magnetic layer 32 is provided between a portion of the first conductive region 21 and a portion of the second insulating region 52 in the Z-axis direction.

A portion of the fourth magnetic layer 34 is provided between a portion of the second conductive region 22 and a portion of the second insulating region 52 in the Z-axis direction. The end portion in the X-axis direction of the fourth magnetic layer 34 is provided between a portion of the second conductive region 22 and a portion of the second insulating region 52 in the Z-axis direction.

The surface of the second insulating region 52 crossing the X-axis direction is tilted with respect to the Z-axis direction.

Figure 10:
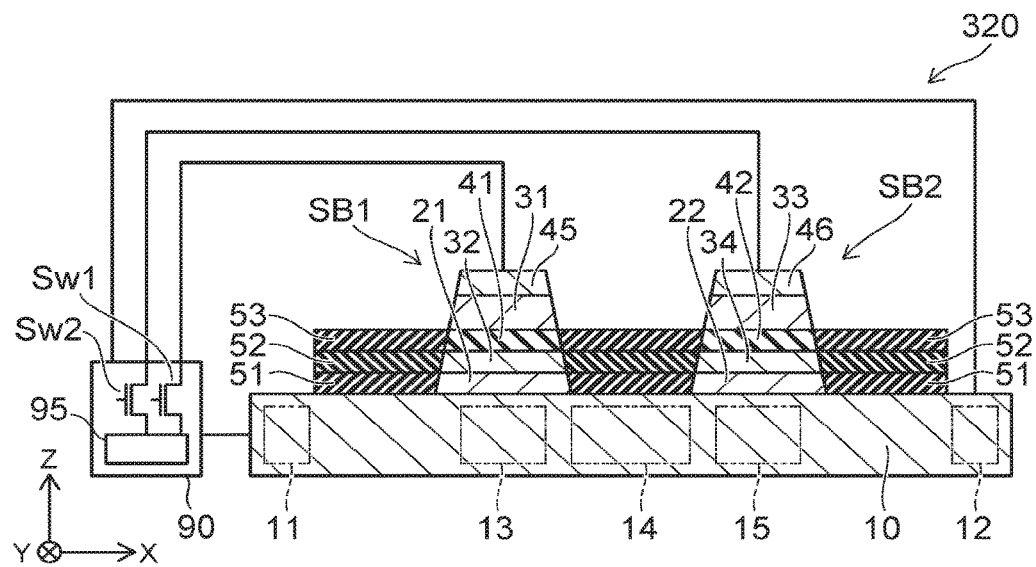

FIG. 10 is a cross-sectional view illustrating another magnetic memory device according to the third embodiment.

The magnetic memory device 320 illustrated in FIG. 10 further includes the third insulating region 53.

A portion of the first nonmagnetic layer 41 is provided between a portion of the second magnetic layer 32 and a portion of the third insulating region 53 in the Z-axis direction. The end portion in the X-axis direction of the first nonmagnetic layer 41 is provided between a portion of the second magnetic layer 32 and a portion of the third insulating region 53 in the Z-axis direction.

A portion of the second nonmagnetic layer 42 is provided between a portion of the fourth magnetic layer 34 and a portion of the third insulating region 53 in the Z-axis direction. The end portion in the X-axis direction of the second nonmagnetic layer 42 is provided between a portion of the fourth magnetic layer 34 and a portion of the third insulating region 53 in the Z-axis direction.

The surface of the third insulating region 53 crossing the X-axis direction is tilted with respect to the Z-axis direction.

Figure 11:
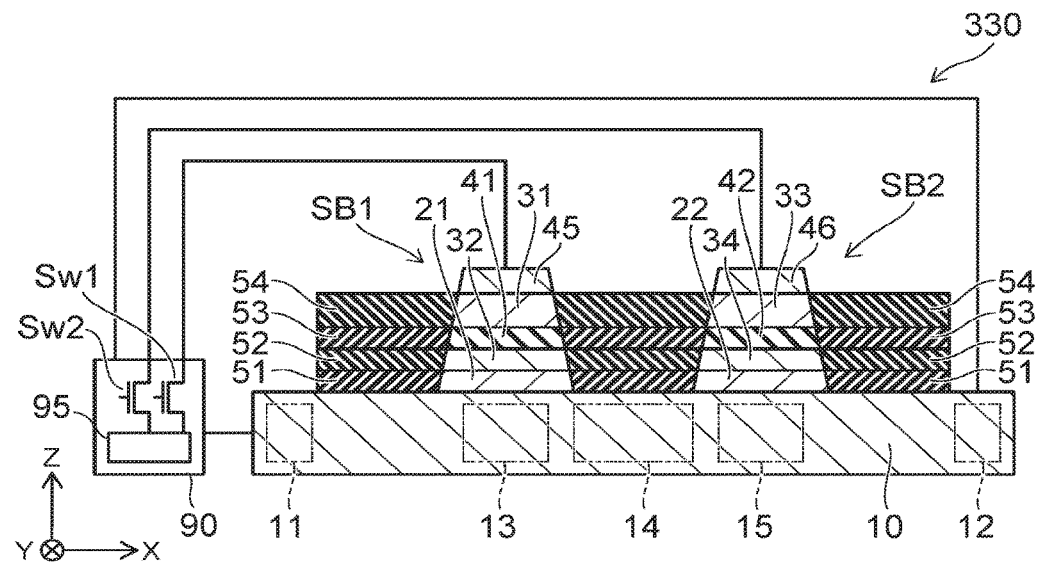

FIG. 11 is a cross-sectional view illustrating another magnetic memory device according to the third embodiment.

The magnetic memory device 330 illustrated in FIG. 11 further includes the fourth insulating region 54.

A portion of the first magnetic layer 31 is provided between a portion of the first nonmagnetic layer 41 and a portion of the fourth insulating region 54 in the Z-axis direction. The end portion in the X-axis direction of the first magnetic layer 31 is provided between a portion of the first nonmagnetic layer 41 and a portion of the fourth insulating region 54 in the Z-axis direction.

A portion of the third magnetic layer 33 is provided between a portion of the second nonmagnetic layer 42 and a portion of the fourth insulating region 54 in the Z-axis direction. The end portion in the X-axis direction of the third magnetic layer 33 is provided between a portion of the second nonmagnetic layer 42 and a portion of the fourth insulating region 54 in the Z-axis direction.

The surface of the fourth insulating region 54 crossing the X-axis direction is tilted with respect to the Z-axis direction.

Figure 12:
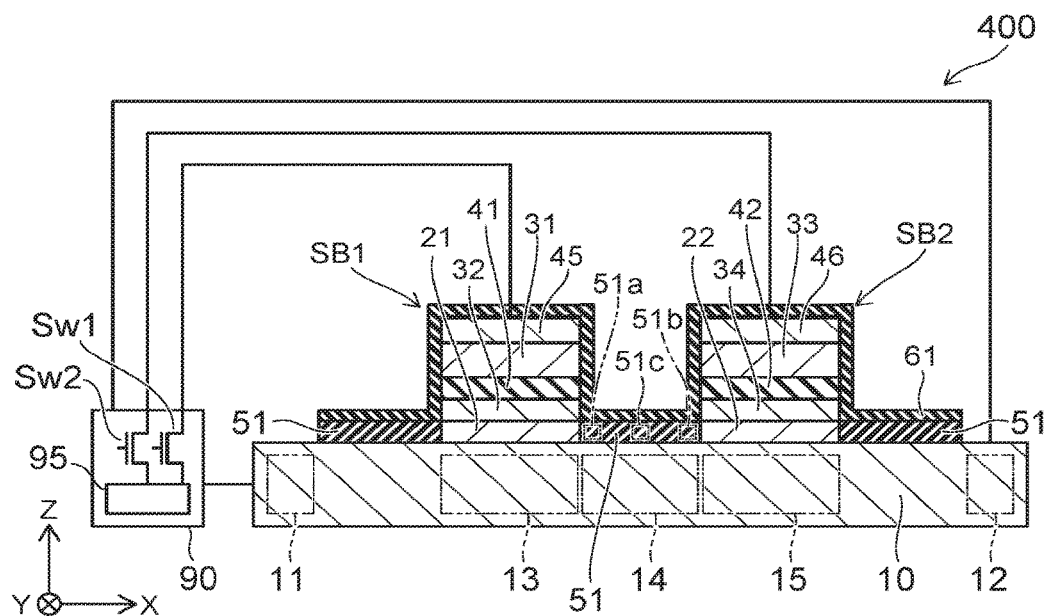
FIG. 12 is a cross-sectional view illustrating a magnetic memory device according to a fourth embodiment.

FIG. 12 is a cross-sectional view illustrating a magnetic memory device according to a fourth embodiment.

In the magnetic memory device 400 illustrated in FIG. 12, the first insulating region 51 includes a first partial region 51a, a second partial region 51b, and a third partial region 51c. The direction from the first partial region 51a toward the second partial region 51b is aligned with the X-axis direction. The third partial region 51c is provided between the first partial region 51a and the second partial region 51b in the X-axis direction.

The distance in the X-axis direction between the first partial region 51a and the first conductive region 21 is shorter than the distance in the X-axis direction between the first partial region 51a and the second conductive region 22. The distance in the X-axis direction between the second partial region 51b and the second conductive region 22 is shorter than the distance in the X-axis direction between the second partial region 51b and the first conductive region 21. The distance in the X-axis direction between the third partial region 51c and the first conductive region 21 is, for example, equal to the distance in the X-axis direction between the third partial region 51c and the second conductive region 22.

The oxygen concentration in the third partial region 51c is, for example, higher than the oxygen concentration in the first partial region 51a and higher than the oxygen concentration in the second partial region 51b.

Or, the first partial region 51a, the second partial region 51b, and the third partial region 51c region include nitrogen. The nitrogen concentration in the third partial region 51c is, for example, higher than the nitrogen concentration in the first partial region 51a and higher than the nitrogen concentration in the second partial region 51b.

The first insulating region 51 may include the first partial region 51a, the second partial region 51b, and the third partial region 51c in the magnetic memory devices illustrated in FIG. 4 to FIG. 11.

As illustrated in FIG. 12, the magnetic memory device 400 may further include a first insulating layer 61. The first insulating layer 61 overlaps the first stacked body SB1 and the second stacked body SB2 in the X-axis direction and the Z-axis direction. The first insulating region 51 is provided between the fourth portion 14 and a portion of the first insulating layer 61 in the Z-axis direction. The first insulating layer 61 includes, for example, at least one selected from the group consisting of silicon oxide and silicon nitride.

For example, the first insulating layer 61 is formed after the process of FIG. 2B and prior to the process of FIG. 3A. Oxidization or nitridation of the magnetic layers 31B and 32B can be suppressed by oxidizing or nitriding a portion of the conductive film 20A in the state in which the first insulating layer 61 is provided.

Figure 13:
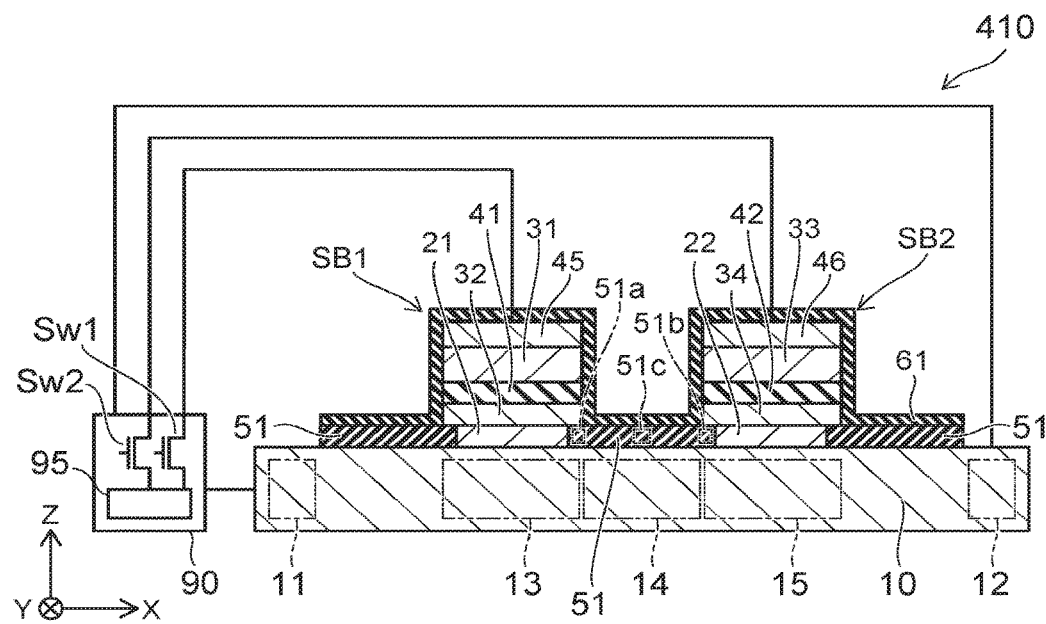
FIG. 13 is a cross-sectional view illustrating another magnetic memory device according to the fourth embodiment.

FIG. 13 is a cross-sectional view illustrating another magnetic memory device according to the fourth embodiment.

In the magnetic memory device 410 illustrated in FIG. 13, the direction from the first partial region 51a toward a portion of the second magnetic layer 32 is aligned with the Z-axis direction. The first partial region 51a is provided between a portion of the third portion 13 and a portion of the second magnetic layer 32 in the Z-axis direction. The direction from the second partial region 51b toward a portion of the fourth magnetic layer 34 is aligned with the Z-axis direction. The second partial region 51b is provided between a portion of the fifth portion 15 and a portion of the fourth magnetic layer 34 in the Z-axis direction.

Figure 14:
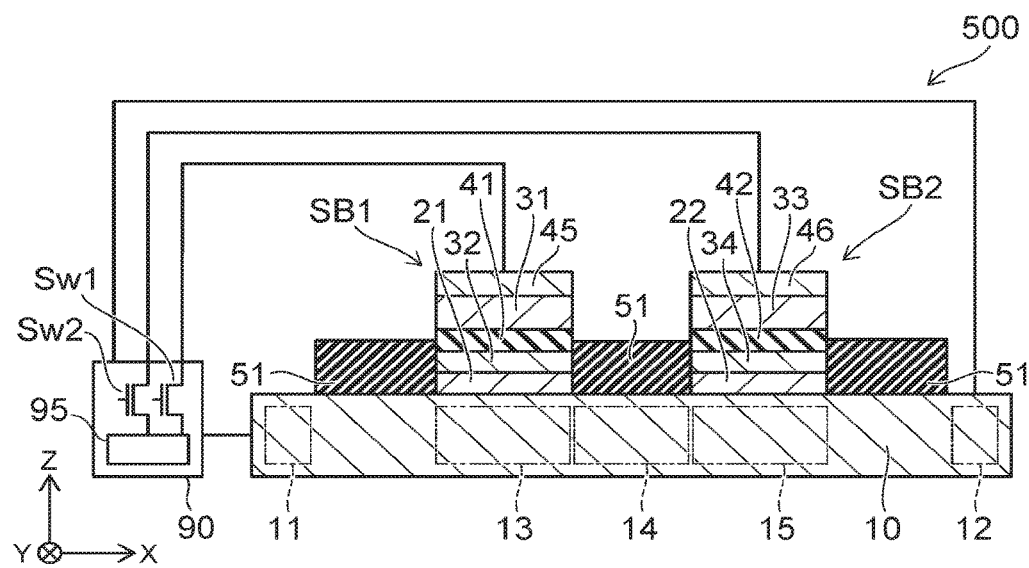
FIG. 14 is a cross-sectional view illustrating a magnetic memory device according to a fifth embodiment.

FIG. 14 is a cross-sectional view illustrating a magnetic memory device according to a fifth embodiment.

In the magnetic memory device 500 illustrated in FIG. 14, the length in the Z-axis direction of the first insulating region 51 may be longer than the length in the Z-axis direction of the first conductive region 21. For example, the direction from the second magnetic layer 32 and the fourth magnetic layer 34 toward a portion of the first insulating region 51 is aligned with the X-axis direction. For example, the direction from the first nonmagnetic layer 41 and the second nonmagnetic layer 42 toward another portion of the first insulating region 51 is aligned with the X-axis direction. Further, the direction from the first magnetic layer 31 and the third magnetic layer 33 toward another portion of the first insulating region 51 may be aligned with the X-axis direction.

Similarly to the other embodiments, the magnetic memory device 500 illustrated in FIG. 14 may include the second insulating region 52, the third insulating region 53, and the fourth insulating region 54. In such a case, for example, the direction from the first magnetic layer 31 and the third magnetic layer 33 toward the second insulating region 52 is aligned with the X-axis direction.

Figure 15:
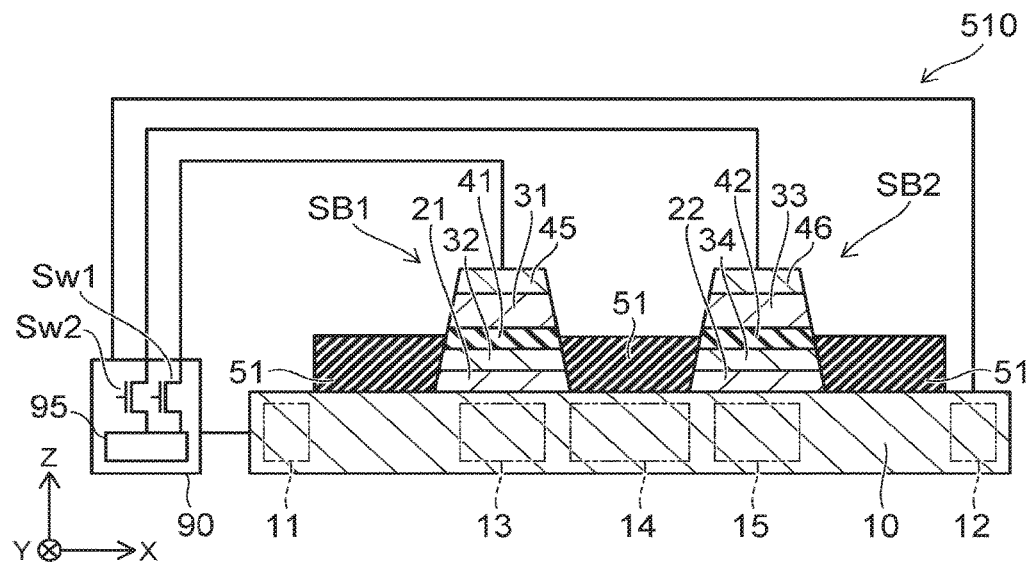
FIG. 15 is a cross-sectional view illustrating another magnetic memory device according to the fifth embodiment.

FIG. 15 is a cross-sectional view illustrating another magnetic memory device according to the fifth embodiment.

In the magnetic memory device 510 illustrated in FIG. 15, a portion of the first conductive region 21 and a portion of the second magnetic layer 32 are provided between a portion of the conductive layer 10 and a portion of the first insulating region 51 in the Z-axis direction. A portion of the first nonmagnetic layer 41 may be provided between a portion of the conductive layer 10 and a portion of the first insulating region 51 in the Z-axis direction. Further, a portion of the first magnetic layer 31 may be provided between a portion of the conductive layer 10 and a portion of the first insulating region 51 in the Z-axis direction.

A portion of the second conductive region 22 and a portion of the fourth magnetic layer 34 are provided between another portion of the conductive layer 10 and another portion of the first insulating region 51 in the Z-axis direction. A portion of the second nonmagnetic layer 42 may be provided between another portion of the conductive layer 10 and another portion of the first insulating region 51 in the Z-axis direction. Further, a portion of the third magnetic layer 33 may be provided between another portion of the conductive layer 10 and another portion of the first insulating region 51 in the Z-axis direction.

Figure 16A:
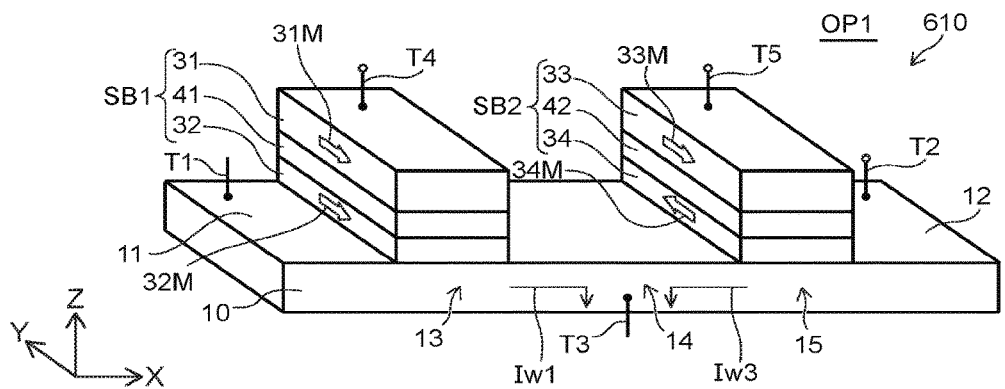
FIG. 16A to FIG. 16C are perspective views illustrating a magnetic memory device according to a sixth embodiment.
Figure 16B:
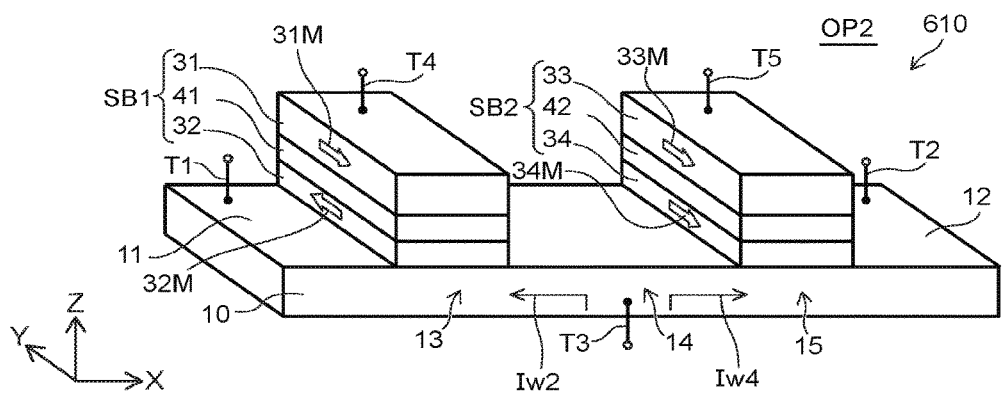
Figure 16C:
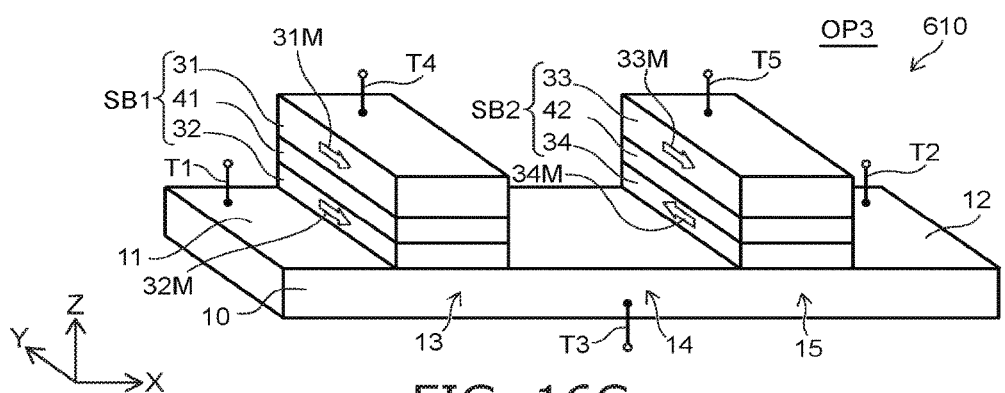

FIG. 16A to FIG. 16C are perspective views illustrating a magnetic memory device according to a sixth embodiment.

The magnetic memory device includes the conductive layer 10, the first stacked body SB1, and the second stacked body SB2. Part of the components included in the magnetic memory device 610 such as the conductive regions, electrodes, insulating regions, etc., are omitted in FIG. 16A to FIG. 16C.

As shown in FIG. 16A, the multiple stacked body (the first stacked body SB1 and the stacked body SB2) are provided in the magnetic memory device 220 according the present embodiment. In the magnetic memory device 220, a current flowing at the first stacked body SB1 and a current flowing at the second stacked body SB2 are different from each other.

The first stacked body SB1 overlaps the third portion 13 in the first direction (the Z-axis direction). The second stacked body SB2 overlaps the fifth portion 15 in the first direction. The fourth portion 14 of the conductive layer 10 corresponds to a portion between the first stacked body SB1 and the second stacked body SB2.

For example, a first terminal T1 is electrically connected to the first portion 11 of the conductive layer 10. A second terminal T2 is electrically connected to the second portion 12. A third terminal T3 is electrically connected to the fourth portion 14. A fourth terminal T4 is electrically connected to the first magnetic layer 31. A fifth terminal T5 is electrically connected to the third magnetic layer 33.

As shown in FIG. 16A, in one operation OP1, a first current Iw1 flows from the first terminal T1 toward the third terminal T3 and a third current Iw3 flows from the second terminal T2 toward the third terminal T3. The orientation of the current (the first current Iw1) at the position of the first stacked body SB1 is opposite to the orientation of the current (the third current Iw3) at the position of the second stacked body SB2. In this operation OP1, the orientation of the spin hall torque interacting with the second magnetic layer 22 of the first stacked body SB1 is opposite to the orientation of the spin hall torque interacting with the fourth magnetic layer 24 of the second stacked body SB2.

In another operation OP2 shown in FIG. 16B, a second current Iw2 flows from the third terminal T3 toward the first terminal T1 and a fourth current Iw4 flows from the third terminal T3 toward the second terminal T2. The orientation of the current (the second current Iw2) at the position of the first stacked body SB1 is opposite to the orientation of the current (the fourth current Iw4) at the position of the second stacked body SB2. In this operation OP2, the orientation of the spin hall torque interacting with the second magnetic layer 22 of the first stacked body SB1 is opposite to the orientation of the spin hall torque interacting with the fourth magnetic layer 24 of the second stacked body SB2.

As shown in FIG. 16A and FIG. 16B, the orientation of the fourth magnetization 24M of the fourth magnetic layer 24 is opposite to the orientation of the second magnetization 22M of the second magnetic layer 22. The orientation of the third magnetization 23M of the third magnetic layer 23 is same as the orientation of the first magnetization 21M of the first magnetic layer 21. As described above, the first stacked body SB1 and the second stacked body SB2 store a plurality of magnetic information which the orientations are opposite to each other. For example, information (data) in the case where the operation OP1 is implemented corresponds to "1". For example, information (data) in the case where the operation OP2 is implemented corresponds to "0". For example, it is possible to read the magnetic information at high-speed, as described below, by implementing these operations.

In the operation OP1 and the operation OP2, the second magnetization 32M of the second magnetic layer 32 and spin currents of electrons (polarized electron) flowing in the conductive layer 10 interact with each other. The orientation of the second magnetization 32M and the orientation of the polarized electrons spin become the relation of being parallel or anti-parallel. The second magnetization 32M of the second magnetic layer 32 precesses and reverse. In the operation OP1 and the operation OP2, the orientation of the fourth magnetization 34M of the fourth magnetic layer 34 and the orientation of the polarized electrons spin become the relation of being parallel or anti-parallel. The fourth magnetization 34M of the fourth magnetic layer 24 precesses and reverse.

FIG. 16C illustrates the reading operation of the magnetic memory device 220. In a reading operation OP3, an electric potential of the fourth terminal T4 is taken as a fourth electric potential V4. An electric potential of the fifth terminal T5 is taken as a fifth electric potential V5. The fourth electric potential V4 is, for example, ground potential. The difference of the electric potentials between the fourth electric potential V4 and the fifth electric potential V5 is taken as ΔV. Two electric resistances of each of the stacked bodies are respectively taken as a high resistance Rh and a low resistance Rl. The high resistance Rh is higher than the low resistance Rl. For example, the high resistance Rh corresponds to a resistance when the first magnetization 31M and the second magnetization 32M are anti-parallel. For example, the low resistance Rl corresponds to a resistance when the first magnetization 31M and the second magnetization 32M are parallel. For example, the high resistance Rh corresponds to a resistance when the third magnetization 33M and the fourth magnetization 34M are anti-parallel. For example, the low resistance Rl corresponds to a resistance when the third magnetization 33M and the fourth magnetization 34M are parallel.

For example, in the operation OP1 ("1" state) shown in FIG. ○A, an electric potential Vr1 of the third terminal T3 is represented by the formula (1).

$$Vr1 = \{Rl/(Rl+Rh)\} \times \Delta V \quad (1)$$

In the operation OP2 ("0" state) shown in FIG. ○B, an electric potential Vr2 of the third terminal T3 is represented by the formula (2).

$$Vr2 = \{Rh/(Rl+Rh)\} \times \Delta V \quad (2)$$

Thus, the potential change ΔVr between the "1" state and the "0" state is represented by the formula (3).

$$\Delta Vr = Vr2 - Vr1 = \{(Rh-Rl)/(Rl+Rh)\} \times \Delta V \quad (3)$$

The potential change ΔVr is, for example, obtained by measuring the electric potential of the third terminal T3.

By the reading operation OP3, for example, it is possible to reduce the consumption energy while reading compared to the case where a voltage (an electric potential difference) between two magnetic layers of a magnetoresistance element is measure by supplying a constant current to the stacked body (the magnetoresistance element). In the operation OP3, for example, it is possible to read at high speed.

In the operation OP1 and the operation OP2, it is possible to control the perpendicular magnetic anisotropy of each of the second magnetic layer 32 and the fourth magnetic layer 34 using the fourth terminal T4 and the fifth terminal T5. Thereby, it is possible to reduce the writing current. For example, the writing current becomes almost half compared to the case where the writing is implemented without using the fourth terminal T4 and the fifth terminal T5. For example, it is possible to reduce the electric charge for the writing. The relation between the polarizations of the voltages applied to the fourth terminal T4 and the fifth terminal T5 and the increase or decrease of the perpendicular magnetic anisotropy depends on the materials of the magnetic layers and the conductive layer 10.

In the above operation shown in FIG. 16C, the first terminal T1 and the second terminal T2 may be set to the same electric potential, the fourth terminal T4 and the fifth terminal T5 may be connected to an input terminal of a sense amplifier, and the difference of the electric potentials between the fourth terminal T4 and the fifth terminal T5 may be measured by the sense amplifier. One of the first terminal T1 and the second terminal T2 may be applied with a voltage, the other of the first terminal T1 and the second terminal T2 may be set at a floating potential. Or, currents may flow in the first terminal T1 and the second terminal T2 and the difference of the current value between at the second terminal T2 and at the fourth terminal T4 may be measured. Further, the first terminal T1 and the second terminal T2 may be set at the same electric potential, the fourth terminal T4 and the fifth terminal T5 may be connected to the input terminal of the sense amplifier, and the difference of the electric potentials between the fourth terminal T4 and the fifth terminal T5 may be measured by the sense amplifier. Further, the fourth terminal T4 and the fifth terminal T5 may be set at the same electric potential, the first terminal T1 and the second terminal T2 may be connected to the input terminal of the sense amplifier, and the difference of the electric potentials between the first terminal T1 and the second terminal T2 may be measured by the sense amplifier.

Figure 17:
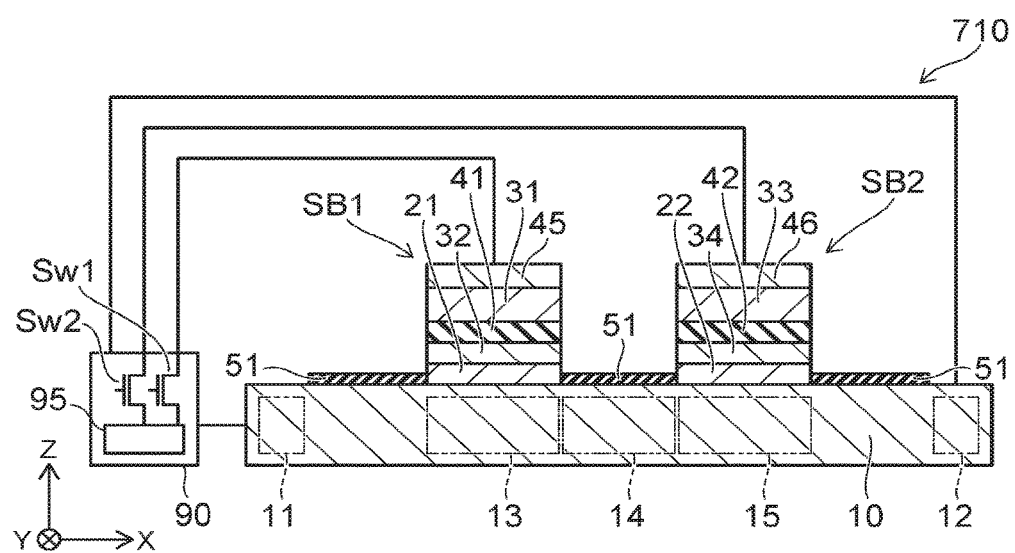
FIG. 17 is a cross-sectional view illustrating a magnetic memory device according to a seventh embodiment.

FIG. 17 is a cross-sectional view illustrating a magnetic memory device according to a seventh embodiment.

In a magnetic memory device 710 shown in FIG. 17, the length in the Z-axis direction of the first insulating region 51 is shorter than a length in the length in the Z-axis direction of the first conductive region 21. The length in the Z-axis direction of the first insulating region 51 is shorter than a length in the length in the Z-axis direction of the second conductive region 22.

According to the embodiments described above, the operating voltage of the magnetic memory device can be reduced.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the conductive layer 10, the first conductive region 21, the second conductive region 22, the third conductive region 23, the first magnetic layer 31, the second magnetic layer 32, the third magnetic layer 33, the fourth magnetic layer 34, the first nonmagnetic layer 41, the second magnetic layer 42, the electrodes 45 and 46, the first insulating region 51, the second insulating region 52, the third insulating region 53, the fourth insulating region 54, the controller 90, the drive circuit 95, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a conductive layer including a first element, the conductive layer including a first portion, a second portion, a third portion between the first portion and the second portion, and a fourth portion between the second portion and the third portion;
   a first magnetic layer separated from the third portion in a second direction crossing a first direction, the first direction being from the first portion toward the second portion;
   a first nonmagnetic layer, at least a portion of the first nonmagnetic layer being provided between the first magnetic layer and at least a portion of the third portion;
   a second magnetic layer, at least a portion of the second magnetic layer being provided between the first nonmagnetic layer and at least a portion of the third portion;
   a first conductive region including a second element different from the first element, at least a portion of the first conductive region being provided between the second magnetic layer and at least a portion of the third portion;
   a first insulating region including a first insulating substance, the first insulating substance being an insulating compound of the second element, a direction from the fourth portion toward at least a portion of the first insulating region being aligned with the second direction; and
   a controller electrically connected to the first portion and the second portion,
   the controller implementing
      a first operation of supplying a first current to the conductive layer from the first portion toward the second portion, and
      a second operation of supplying a second current to the conductive layer from the second portion toward the first portion.

2. The device according to claim 1, further comprising:
   a third magnetic layer;
   a second nonmagnetic layer;
   a fourth magnetic layer; and
   a second conductive region,
   the conductive layer further including a fifth portion between the second portion and the fourth portion,
   the third magnetic layer being separated from the fifth portion in the second direction,
   at least a portion of the second nonmagnetic layer being provided between the third magnetic layer and at least a portion of the fifth portion, at least a portion of the fourth magnetic layer being provided between the second nonmagnetic layer and at least a portion of the fifth portion, the second conductive region including the second element, at least a portion of the second conductive region being provided between the fourth magnetic layer and at least a portion of the fifth portion, the first insulating region being provided between the first conductive region and the second conductive region in the first direction.

3. The device according to claim 1, further comprising a third conductive region, the third conductive region being provided between the fourth portion and the first insulating region in the second direction, the third conductive region including the second element.

4. The device according to claim 1, further comprising a second insulating region, at least a portion of the first insulating region being provided between the fourth portion and at least a portion of the second insulating region in the second direction, the second magnetic layer including a first magnetic material, the second insulating region including an insulating compound of the first magnetic material.

5. The device according to claim 4, wherein a direction from the second magnetic layer toward the second insulating region is aligned with the first direction.

6. The device according to claim 4, wherein a portion of the second magnetic layer is provided between a portion of the first conductive region and a portion of the second insulating region in the second direction.

7. The device according to claim 4, further comprising a third insulating region, at least a portion of the second insulating region being provided between the first insulating region and at least a portion of the third insulating region in the second direction, the first nonmagnetic layer including a first insulating material, the third insulating region including the first insulating material.

8. The device according to claim 7, wherein a direction from the first nonmagnetic layer toward the third insulating region is aligned with the first direction.

9. The device according to claim 7, wherein a portion of the first nonmagnetic layer is provided between a portion of the second magnetic layer and a portion of the third insulating region in the second direction.

10. The device according to claim 7, further comprising a fourth insulating region, at least a portion of the third insulating region being provided between the second insulating region and at least a portion of the fourth insulating region in the second direction, the first magnetic layer including a second magnetic material, the fourth insulating region including an insulating compound of the second magnetic material.

11. The device according to claim 10, wherein a direction from the first magnetic layer toward the fourth insulating region is aligned with the first direction.

12. The device according to claim 10, wherein a portion of the first magnetic layer is provided between a portion of the first nonmagnetic layer and a portion of the fourth insulating region in the second direction.

13. The device according to claim 1, wherein the first insulating region includes a first partial region, a second partial region, and a third partial region, a direction from the first partial region toward the second partial region is aligned with the first direction, the third partial region is provided between the first partial region and the second partial region in the first direction, and an oxygen concentration in the third partial region is higher than an oxygen concentration in the first partial region and higher than an oxygen concentration in the second partial region.

14. The device according to claim 1, wherein the first insulating region includes a first partial region, a second partial region, and a third partial region, a direction from the first partial region toward the second partial region is aligned with the first direction, the third partial region is provided between the first partial region and the second partial region in the first direction, and an nitrogen concentration in the third partial region is higher than an nitrogen concentration in the first partial region and higher than an nitrogen concentration in the second partial region.

15. The device according to claim 4, wherein the first magnetic material is at least one selected from a third group consisting of cobalt, nickel, iron, platinum, palladium, boron, and copper.

16. The device according to claim 4, wherein the first insulating region further includes at least one selected from a fourth group consisting of an insulating compound of the first element and an insulating compound of the first magnetic material.

17. The device according to claim 1, wherein the first element is at least one selected from a first group consisting of tantalum, tungsten, rhenium, osmium, iridium, platinum, gold, copper, silver, and palladium.

18. The device according to claim 1, wherein the second element is at least one selected from a second group consisting of boron, magnesium, aluminum, silicon, hafnium, titanium, cesium, zirconium, strontium, lithium, beryllium, calcium, and lanthanum.

19. The device according to claim 1, wherein a length in the second direction of the first insulating region is shorter than a length in the second direction of the first conductive region.

20. A magnetic memory device, comprising:

a conductive layer including a first element, the conductive layer including a first portion, a second portion, a third portion between the first portion and the second portion, a fourth portion between the second portion and the third portion, and a fifth portion between the second portion and the fourth portion, a first magnetic layer separated from the third portion in a second direction crossing a first direction, the first direction being from the first portion toward the second portion;

a first nonmagnetic layer, at least a portion of the first nonmagnetic layer being provided between the first magnetic layer and at least a portion of the third portion;

a second magnetic layer, at least a portion of the second magnetic layer being provided between the first nonmagnetic layer and at least a portion of the third portion;

a first conductive region including a second element different from the first element, at least a portion of the first conductive region being provided between the second magnetic layer and at least a portion of the third portion;
a first insulating region including a first insulating substance, the first insulating substance being an insulating compound of the second element, a direction from the fourth portion toward at least a portion of the first insulating region being aligned with the second direction; and
a controller electrically connected to the first portion and the second portion,
the controller implementing
    a first operation of supplying a first current to the conductive layer from the first portion toward the fourth portion, and
    a second operation of supplying a second current to the conductive layer from the fourth portion toward the first portion.

* * * * *